United States Patent
Co

(10) Patent No.: US 8,035,408 B1
(45) Date of Patent: Oct. 11, 2011

(54) SOCKET FIXTURE FOR TESTING WARPED MEMORY MODULES ON A PC MOTHERBOARD

(75) Inventor: Ramon S. Co, Trabuco Canyon, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 0 days.

(21) Appl. No.: 12/965,693

(22) Filed: Dec. 10, 2010

(51) Int. Cl.
 *G01R 31/00* (2006.01)
 *H01R 13/15* (2006.01)

(52) U.S. Cl. .................... 324/756.02; 439/260

(58) Field of Classification Search ............ 324/756.02; 714/42; 439/260; 29/739
See application file for complete search history.

(56) References Cited

U.S. PATENT DOCUMENTS

| | | | |
|---|---|---|---|
| 6,168,464 B1 * | 1/2001 | Choy et al. ................ | 439/567 |
| 6,357,023 B1 | 3/2002 | Co et al. | |
| 6,371,781 B1 * | 4/2002 | Jones et al. ................. | 439/260 |
| 6,629,855 B1 | 10/2003 | North et al. | |
| 6,705,882 B2 | 3/2004 | Casses | |
| 6,762,615 B2 * | 7/2004 | Lee et al. ................. | 324/756.05 |
| 6,772,261 B1 * | 8/2004 | D'Antonio et al. ........... | 710/301 |
| 6,824,410 B1 * | 11/2004 | Co et al. ....................... | 439/260 |
| 6,981,886 B1 | 1/2006 | Co et al. | |
| 7,117,405 B2 | 10/2006 | Co et al. | |
| 7,131,040 B2 * | 10/2006 | Co et al. ...................... | 714/718 |
| 7,151,368 B2 | 12/2006 | Joung et al. | |
| 7,272,774 B2 | 9/2007 | Co et al. | |
| 7,350,288 B2 * | 4/2008 | Sanders et al. .................. | 29/739 |
| 7,487,413 B2 * | 2/2009 | Lee et al. ...................... | 714/718 |
| 7,607,056 B2 * | 10/2009 | Kang et al. .................... | 714/724 |
| 7,607,931 B2 | 10/2009 | Saitoh et al. | |
| 2007/0269911 A1 * | 11/2007 | Co et al. ........................ | 438/17 |
| 2008/0182443 A1 * | 7/2008 | Beaman et al. ............... | 439/260 |
| 2008/0238460 A1 | 10/2008 | Kress et al. | |
| 2008/0291638 A1 | 11/2008 | Ma et al. | |
| 2009/0085593 A1 | 4/2009 | Yoshida et al. | |
| 2009/0253277 A1 | 10/2009 | Hsieh | |

* cited by examiner

*Primary Examiner* — Vinh Nguyen
*Assistant Examiner* — Joshua Benitez
(74) *Attorney, Agent, or Firm* — Stuart T. Auvinen; gPatent LLC

(57) ABSTRACT

A memory module test socket can accept modules with bent or warped printed-circuit boards (PCBs). A support plate is mounted above a Personal Computer (PC) motherboard by standoffs. An extender card fits through a slot in the support plate. The bottom edge of the extender card is plugged into a motherboard memory module socket on the motherboard. The top of the extender card has an extender socket that sits atop the support plate. End guides are mounted to the support plate and clamp down the extender socket. Funnel guides formed in the end guides have a funnel shape to guide ends of a memory module for better alignment when inserted into the extender socket. A pusher plate with a triangular guide or a perpendicular rod applies a perpendicular force on the middle of a warped memory module to align the middle to the extender socket during insertion.

20 Claims, 6 Drawing Sheets

TOP VIEW

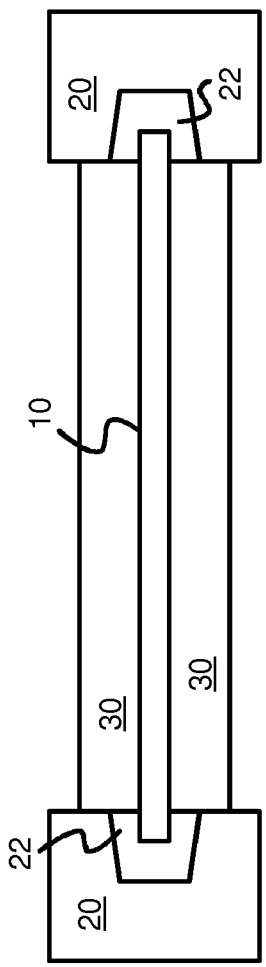
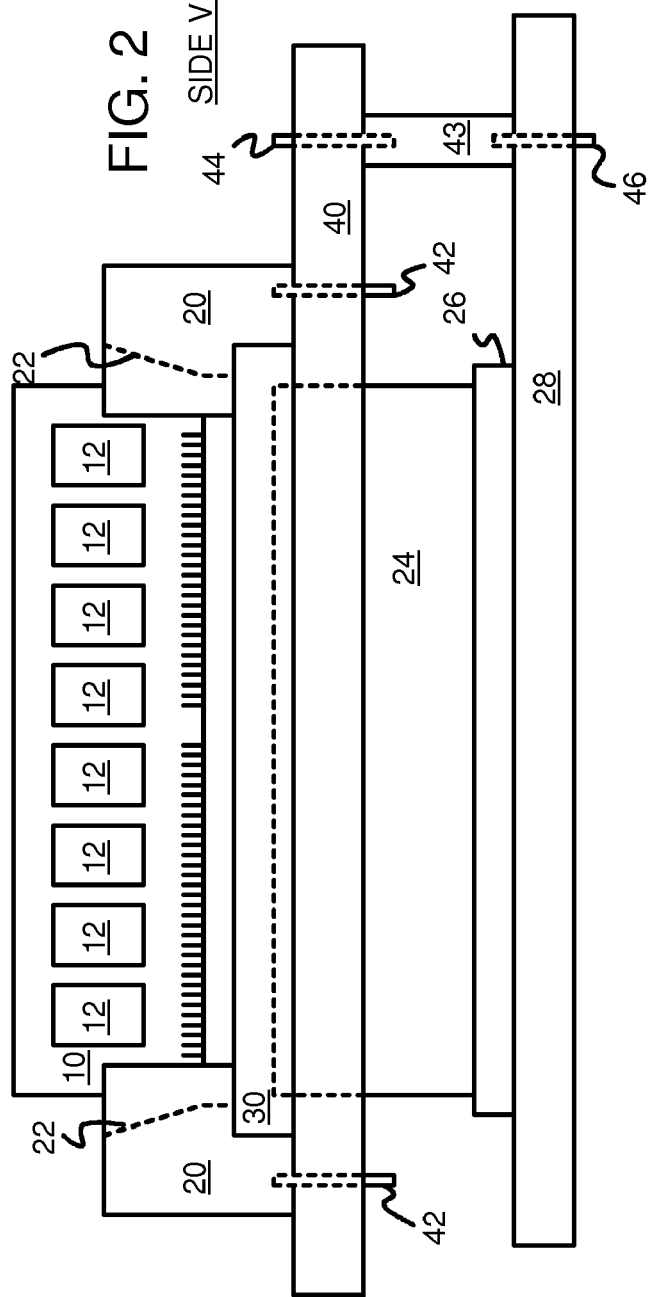

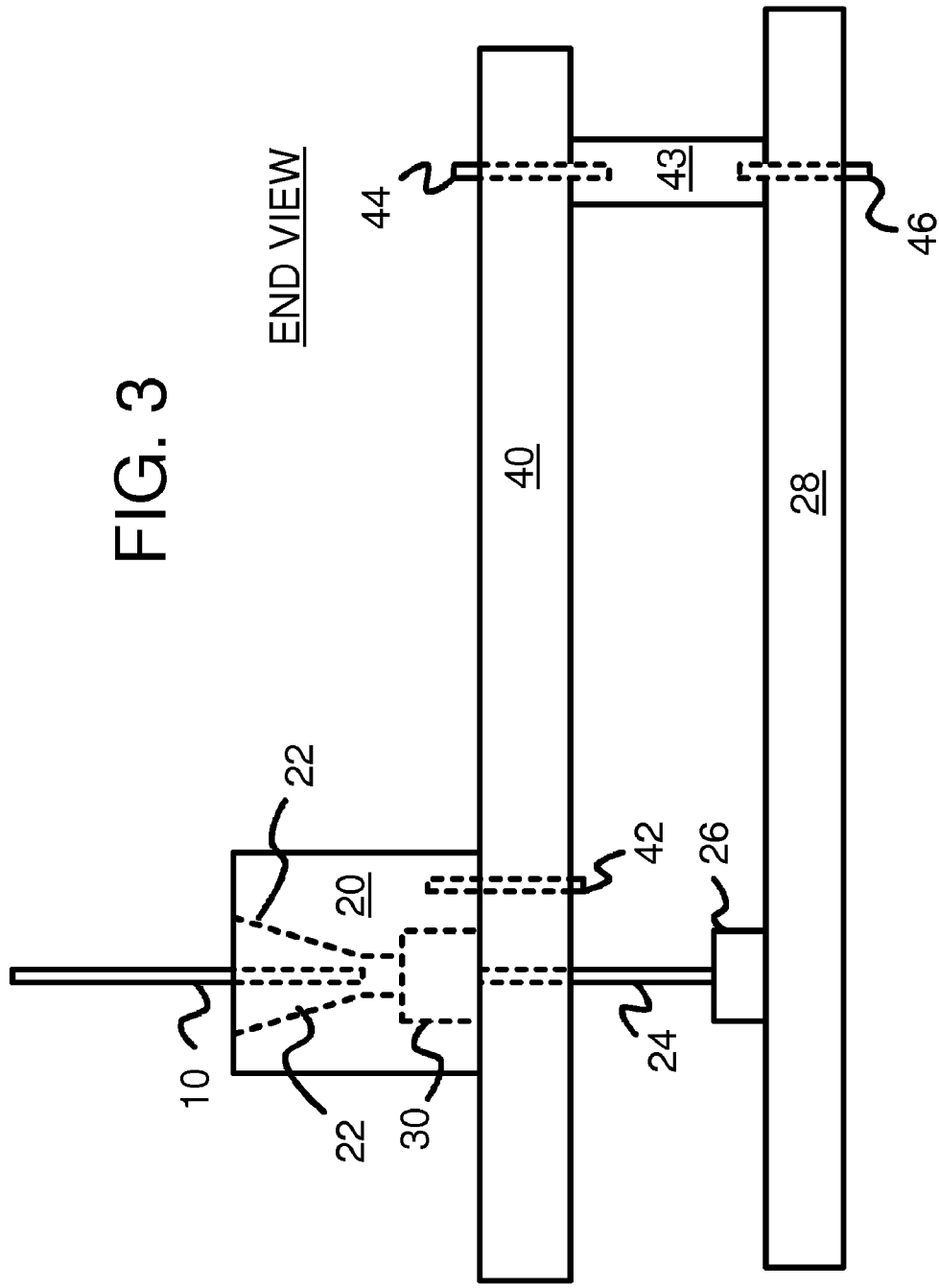

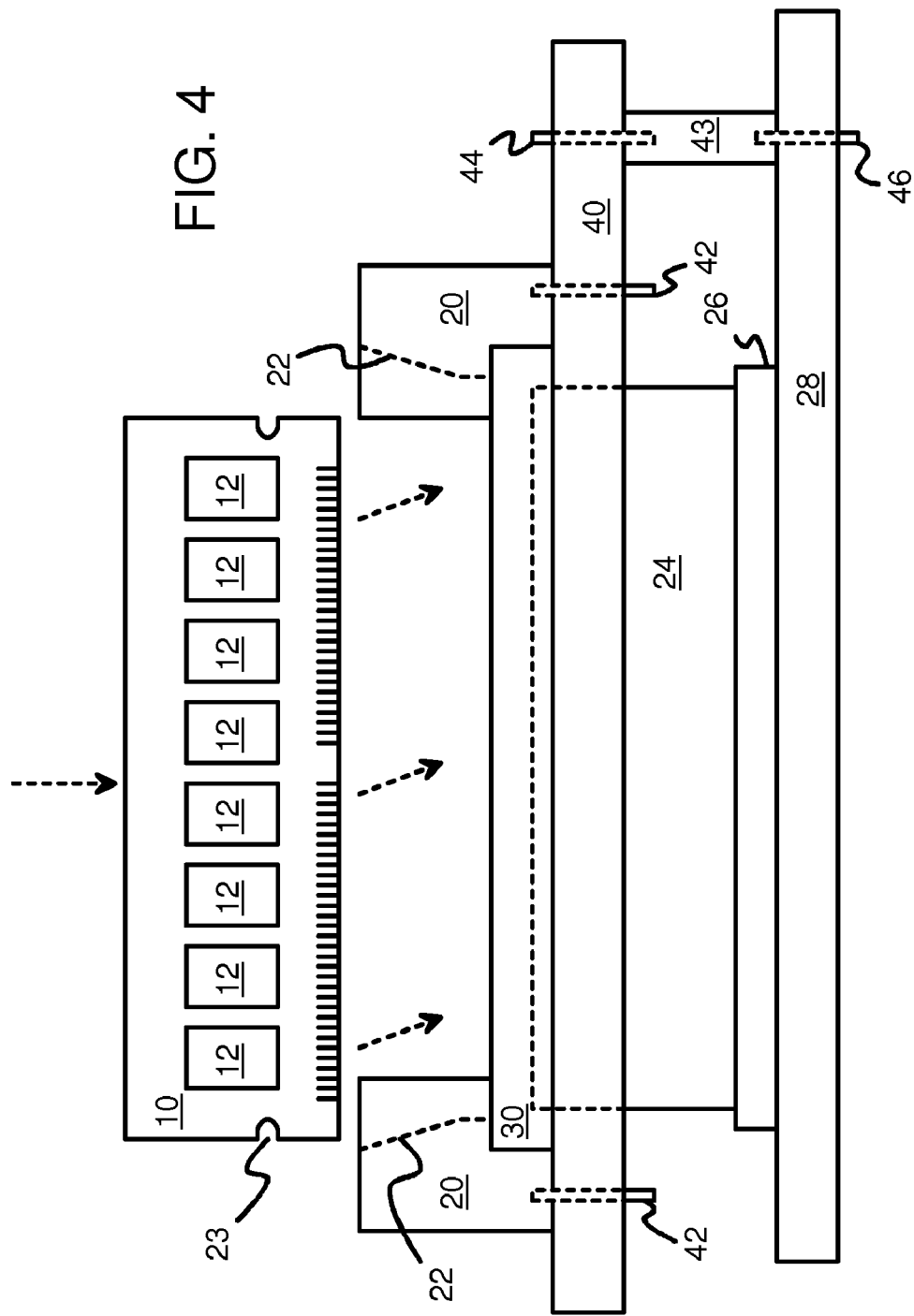

US 8,035,408 B1

SOCKET FIXTURE FOR TESTING WARPED MEMORY MODULES ON A PC MOTHERBOARD

FIELD OF THE INVENTION

This invention relates to memory module test sockets, and more particularly to memory-module test sockets for testing warped modules.

BACKGROUND OF THE INVENTION

Memory modules such as Dual-Inline Memory Modules (DIMMs) are widely used in personal computer (PC) and other systems. Robotic arms may pick and place memory modules into special test sockets. The test sockets may be mounted on an inexpensive PC motherboard rather than on an expensive electronic test machine such as automated-test-equipment (ATE).

Test sockets used in memory module production are typically more durable that ordinary memory modules sockets on an inexpensive PC motherboard. Special attention may be given to providing a smooth insertion of the module into the test socket so that the module is not nicked or otherwise damaged during testing.

While the test socket is usually manufactured to a significant degree of precision, the memory modules may not be as precise. Sometimes the small printed-circuit board (PCB) that the memory chips are soldered to is not exactly planar. A certain amount of bend or warpage may exist. Such warped memory modules may be manually inserted into memory module sockets on a PC motherboard, since the human hand can bend the module board slightly to make it fit into the socket. However, during testing, a robotic arm often is used for module insertion. The robotic arm very precisely moves and places the module into the socket, and is not as adaptive as the human hand. When a robotic arm inserts a warped module into a test socket, often the robotic arm is not able to insert the module properly. The module board's warpage may get caught on part of the test socket and hinder insertion.

What is desired is a memory module test socket and robotic system that can test warped memory modules. A test socket that can accept bent modules is desirable, especially for use with a robotic arm.

BRIEF DESCRIPTION OF THE DRAWINGS

FIG. 1 is a top or overhead view of a memory module test socket.

FIG. 2 is a side view of the memory module test socket.

FIG. 3 is an end view of the memory module test socket.

FIG. 4 highlights better alignment of a mis-aligned memory module inserted into the test socket.

DETAILED DESCRIPTION

Figure 5:
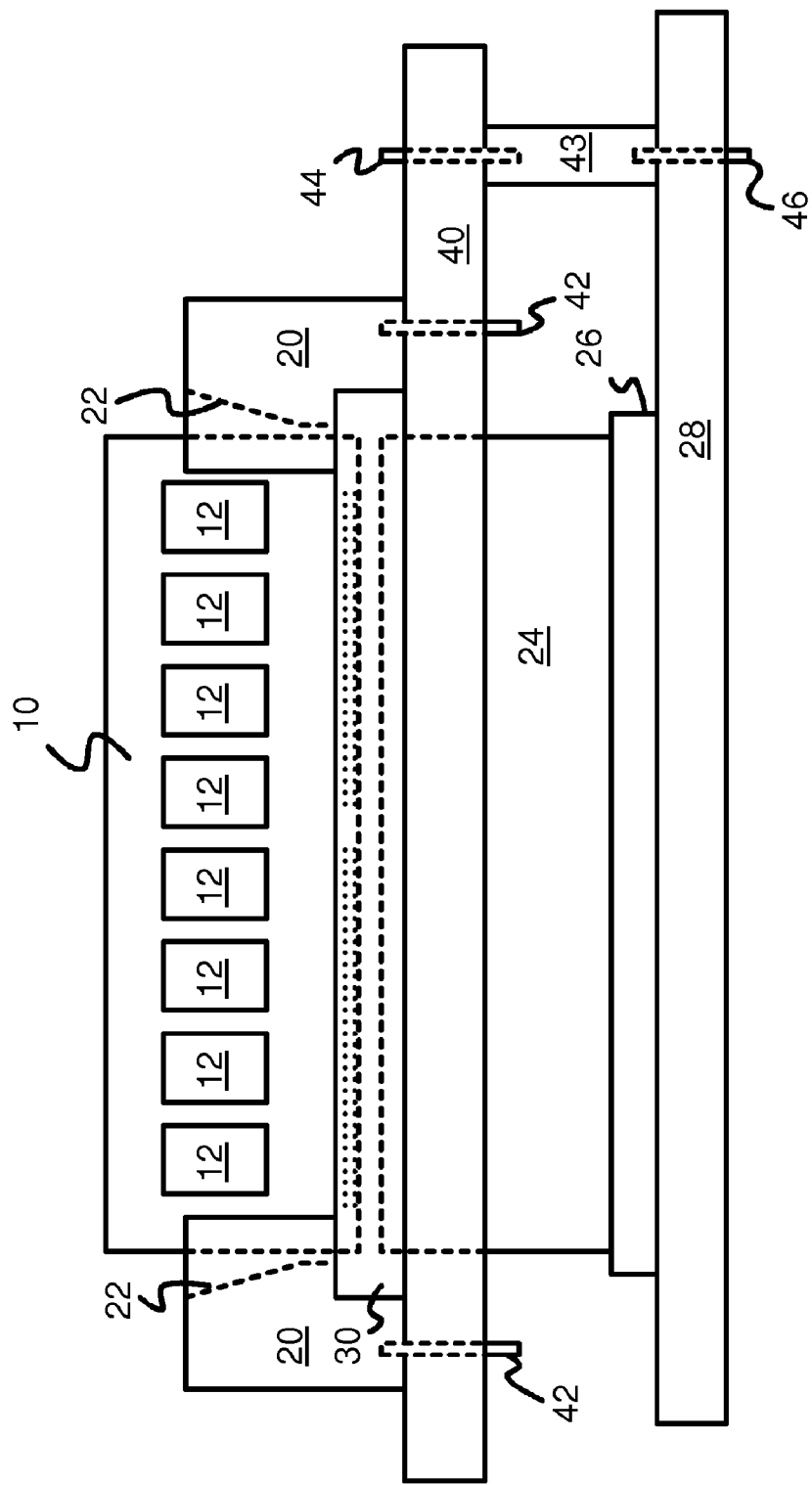
FIG. 5 highlights final alignment of a mis-aligned memory module inserted into the test socket.

The present invention relates to an improvement in memory module test sockets and systems. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

FIG. 1 is a top or overhead view of a memory module test socket. Memory module 10 is inserted into the test socket as the module-under-test (MUT). The ends of memory module 10 fit into funnel guides 22 formed in end guides 20. The funnel or conical shape of funnel guides 22 directs the lower edge of memory module 10 into better alignment with extender socket 30, which has metal contacts that make electrical contact with metal contact pads on the bottom edge of memory module 10. Funnel guides 22 allow for a less accurate placement of memory module 10 in the test socket, which can reduce the cost of the robotic arm or allow for a faster operation, thus reducing test costs.

FIG. 2 is a side view of the memory module test socket. Memory chips 12 may be dynamic-random-access memory (DRAM) chips that are connected to metal contact pads arrayed along the bottom edge of memory module 10 that make electrical contact with metal springs or contacts inside extender socket 30 when fully inserted. Funnel guides 22 are funnel-shaped forms or cutouts of end guides 20 that guide the ends of memory module 10 into alignment with extender socket 30.

Extender card 24 is a small printed-circuit board (PCB) that has extender socket 30 mounted to the top and has metal contact pads on the bottom edge that fits into motherboard memory module socket 26. Motherboard memory module socket 26 can be the standard memory module sockets on the component side of a PC motherboard, or could be replaced with better sockets. Motherboard memory module socket 26 could also be located on the reverse or solder side of motherboard 28, but the added height provided by extender card 24 provides clearance over components on motherboard 28.

Extender card 24 has metal traces that connect metal contacts on the lower edge with spring contacts in extender socket 30 on the top edge. In some embodiments, the corresponding lower and top edge contacts are connected together, although some functionality can be added to extender card 24 such as swapping or crossing over address or data lines.

Support plate 40 can be a rigid plastic plate that has a slot that extender card 24 fits through. Extender socket 30 and end guides 20 can be supported by the top surface of support plate 40. End guides 20 can be mounted to extender socket 30 or to support plate 40 or to both by screws, bolts, clamps, or other mounting methods. For example, pins, bolts, or screws 42 can secure end guides 20 to support plate 40 while extender socket 30 is clamped down to support plate 40 by a step on the bottom of end guides 20.

Standoff 43 is attached to support plate 40 by pins, bolts, or screws 44, and to motherboard 28 by pins, bolts, or screws 46. There are typically several standoffs 43 located on several sides of extender socket 30 rather than just one as shown.

FIG. 3 is an end view of the memory module test socket. Standoff 43 is attached to motherboard 28 by pins, bolts, or screws 46 and to support plate 40 by pins, bolts, or screws 44. Extender card 24 has lower contact pads that fit into motherboard memory module socket 26 and has extender socket 30 that receives metal contacts on memory module 10.

End guides 20 are mounted to support plate 40 by pins, bolts, or screws 42. End guides 20 surround and clamp down the ends of extender socket 30 to support plate 40. Funnel guides 22 are formed inside end guides 20 and guide the edges of memory module 10 into better alignment with extender socket 30 as memory module 10 is pushed further downward.

FIG. 4 highlights better alignment of a mis-aligned memory module inserted into the test socket. Memory module 10 is placed off-center relative to extender socket 30 during insertion. However, funnel guides 22 catch one of the ends of memory module 10 and guide the module to the right as it falls or is pushed downward. Notches 23 on the edges of memory module 10 can accept a levered handle or a spring clip (not shown) in end guides 20 to secure memory module 10 into the test socket once inserted.

FIG. 5 highlights final alignment of a mis-aligned memory module inserted into the test socket. Once the lower edge of memory module 10 reaches the top of extender socket 30, memory module 10 has been re-aligned by funnel guides 22. As memory module 10 is pushed further downward, the lower edge of memory module 10 is forced into extender socket 30 with a proper alignment of metal contact pads so that electrical contact is made.

Figure 6:
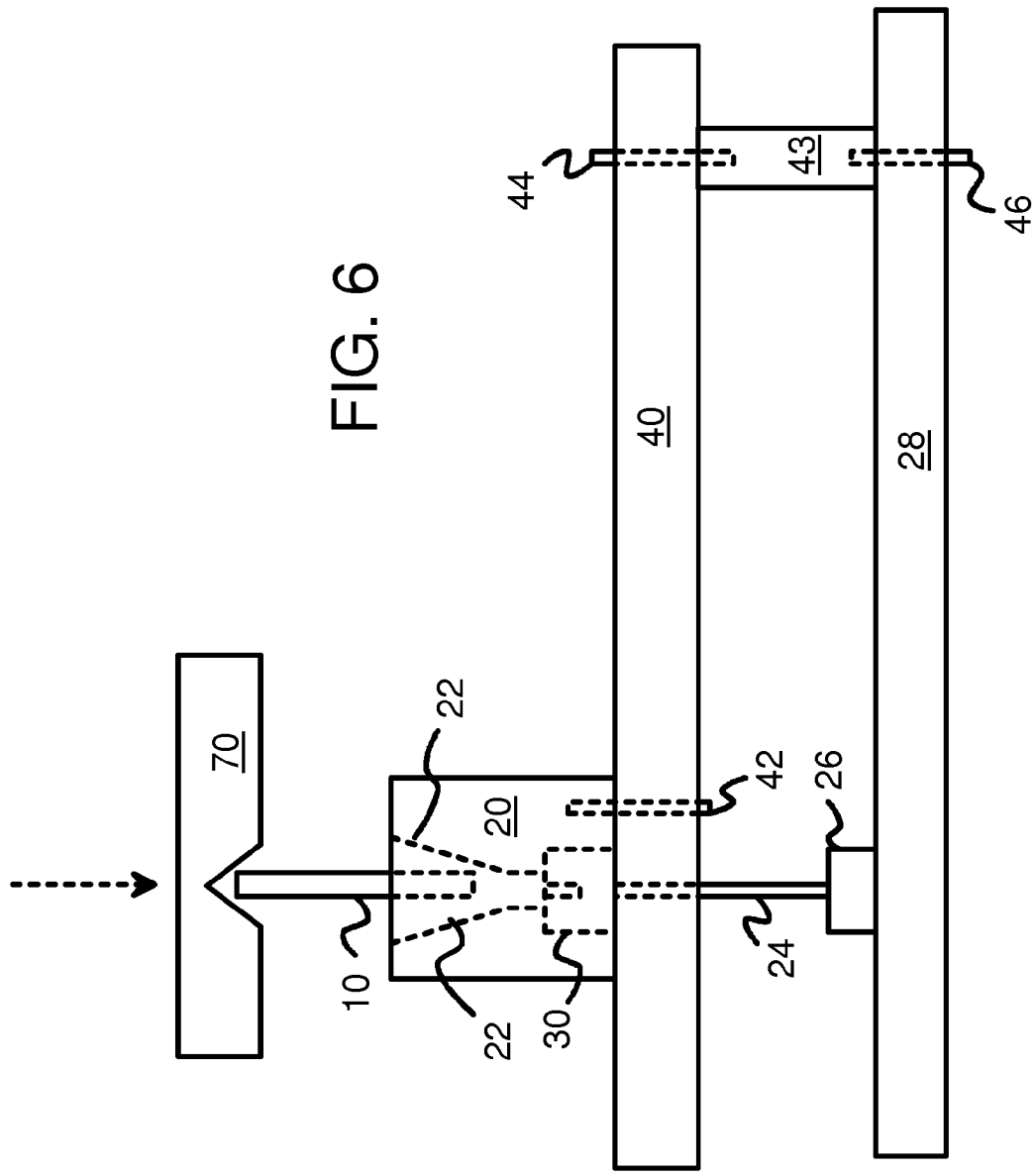
FIG. 6 shows a pusher plate being used to insert a warped memory module.

FIG. 6 shows a pusher plate being used to insert a warped memory module. Pusher plate 70 has a triangular guide that pushes downward upon the top edge of memory module 10 during insertion. If there is a slight bend or warp to memory module 10, the triangular guide of pusher plate 70 can apply a perpendicular force (to the left or right in the end view of FIG. 6) to flex memory module 10 into a flatter position.

Pusher plate 70 and its triangular guide can extend the whole length of memory module 10, or could extend just near the middle of memory module 10.

Figure 7:
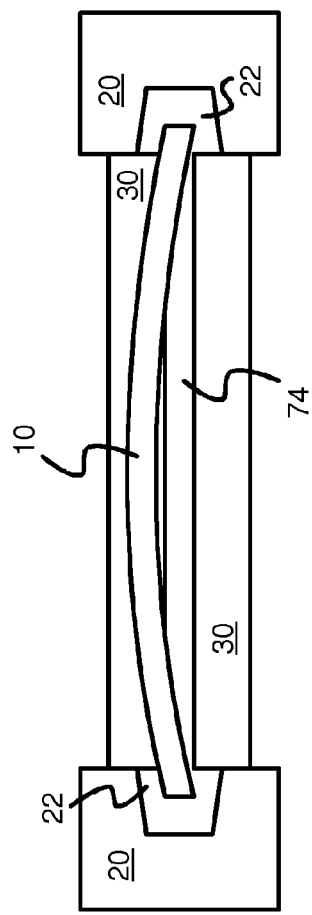
FIG. 7 shows a warped memory module being inserted into the test socket.

FIG. 7 shows a warped memory module being inserted into the test socket. Memory module 10 has a bend or warp on its PCB causing the middle of memory module 10 to be misaligned to slot 74 in extender socket 30 when the ends of memory module 10 are guided into alignment with extender socket 30 by funnel guides 22.

Figure 8:
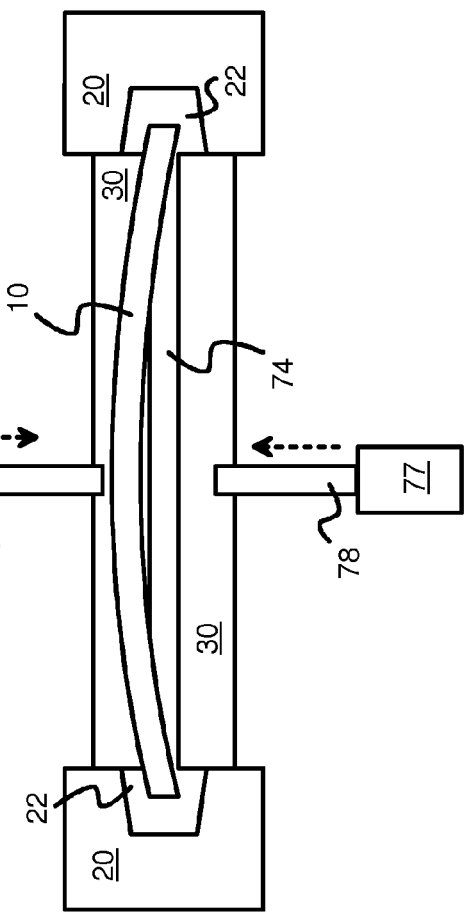
FIG. 8 shows a perpendicular rod that pushes the middle of a warped memory module into alignment with the test socket.

FIG. 8 shows a perpendicular rod that pushes the middle of a warped memory module into alignment with the test socket. Perpendicular rod 76 applies a perpendicular force to the middle of memory module 10, bending the module PCB inward to better align with slot 74. Opposing perpendicular rod 78 applies an opposing perpendicular force when memory module 10 is warped in the other direction from that shown in FIG. 8. Only one of perpendicular rod 76 and opposing perpendicular rod 78 is activated at a time, although in some embodiments both rods 76, 78 could be activated at the same time to pinch the middle of memory module 10 into alignment with slot 74 in extender socket 30. A soft end or tip could be provided to rods 76, 78 where they make contact with memory module 10 to prevent scratching or damage to memory module 10.

Perpendicular rods 76, 78 may be mounted with servos 77 or other motor drives onto support plate 40, or may be part of the robotic arm assembly.

Alternate Embodiments

Several other embodiments are contemplated by the inventors. For example, ejectors may be added to extender socket 30 to aid in removal of memory module 10 after testing is completed. Sliding levered handles may be added to extender socket 30 or to end guides 20 to provide leverage when inserting and removing memory modules. See for instance U.S. Pat. No. 6,981,886 for a mechanism of the sliding levered handle. The levered handles can have an end that engages notches 23 of FIG. 4. A robotic arm may activate the ejectors or levered handles, or an actuator, servo, or other motor or motion device or mechanism may be used to move the ejector or handles. The sliding levered handles may also be mounted to the robotic arm directly. Alternately, the notch engager for notches 23 may also be made a part of the robotic arm.

More than one test socket may be placed on the same support plate 40, and motherboard 28 may have several motherboard memory module sockets 26. Other functions such as for error-correction code (ECC) testing may be added to extender card 24. See for instance U.S. Pat. No. 7,272,774 for ECC testing using an extender card.

Support plate 40 may have a variety of shapes and have various cutouts and slots 74 to fit extender card 24 and components on motherboard 28 that protrude above support plate 40. Support plate 40 may be made from a thicker, more insulating material or fiberglass to improve the rigidity.

More than one memory module socket may be used on support plate 40. Each levered handle could engage just one notch on one memory module, or a notch engager could have an elongated depth so that notches on two or more memory modules could be engaged simultaneously.

Various other enhancements can be made, such as locks, stops, or holding mechanisms for holding levered handle or memory module 10 in its position. The levered handles could be attached to a base that is attached directly to a memory module socket, without using a support plate 40.

Positions such as up, down, etc. are relative and may be interchangeable, such as when the socket is transformed or re-positioned. Support plate 40, standoffs, and extender socket 30 can be made from a variety of materials such as metal or rigid plastic.

Extender socket 30 could be mounted to support plate 40 or to end guides 20 in a variety of other ways, such as by adhesive, clamps, pins, clips, screws, or bolts in various locations, etc. The shape and size of slot 74 can vary, such as one or more long rectangles or ovals to closely fit one or more extender card 24, or other shapes.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening.

Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A warp-compensating memory-module test socket comprising:
    a memory module extender socket having a socket slot for receiving a connector edge of a memory module, the socket slot having metal contacts for contacting metal contacts by the connector edge of the memory module;
    end guides for receiving end edges of the memory module when the memory module is being inserted;
    funnel guides formed inside the end guides, the funnel guides having a funnel shape wherein the end edges of the memory module are moved into better alignment with the memory module extender socket when the end edges of the memory module are slid along the funnel guides as the memory module is inserted more fully into the memory module test socket;
    an extender card having the memory module extender socket mounted on a top edge, and a connector edge having metal contacts for insertion in a memory module socket on a personal computer motherboard;
    the memory module extender socket having a middle portion having the socket slot and having end portions on opposing sides of the middle portion; and
    a support plate having the end portions of the memory module extender socket mounted thereon, the support plate having an opening under at least part of the middle portion of the memory module extender socket, the opening for the extender card to pass through to reach the memory module socket on the personal computer motherboard below the support plate.

2. The warp-compensating memory-module test socket of claim 1 further comprising:
    standoffs mounted between the personal computer motherboard and the support plate, the standoffs for mounting the support plate to the personal computer motherboard.

3. The warp-compensating memory-module test socket of claim 2 further comprising:
    a first perpendicular rod that is activated to apply a first perpendicular force to a middle of the memory module when the memory module is partially inserted into the memory module test socket, wherein the first perpendicular force bends the memory module to allow the middle of the memory module to fit into the socket slot when the memory module comprises a module printed-circuit board (PCB) that is warped;
    wherein the first perpendicular force is normal to an ideal plane of the module PCB, wherein the ideal plane intersects the end edges of the memory module but does not intersect the middle of the memory module due to warpage of the module PCB;
    wherein the first perpendicular rod touches the middle of the memory module to apply the first perpendicular force, wherein the first perpendicular rod is activated to move toward the memory module along a perpendicular axis that is normal to the ideal plane of the module PCB.

4. The warp-compensating memory-module test socket of claim 3 further comprising:
    a first servo that is activated to move the first perpendicular rod along the perpendicular axis toward the middle of the memory module.

5. The warp-compensating memory-module test socket of claim 4 further comprising:
    a second perpendicular rod that is activated to apply a second perpendicular force to a middle of the memory module when the memory module is partially inserted into the memory module test socket, wherein the second perpendicular force bends the memory module to allow the middle of the memory module to fit into the socket slot when the memory module comprises the module PCB that is warped;
    wherein the second perpendicular force is normal to an ideal plane of the module PCB and opposite to the first perpendicular force;
    wherein the second perpendicular rod touches the middle of the memory module to apply the second perpendicular force, wherein the second perpendicular rod is activated to move toward the memory module along the perpendicular axis that is normal to the ideal plane of the module PCB;
    wherein the first perpendicular force is opposite to the second perpendicular force, wherein the first perpendicular rod and the second perpendicular rod move in opposite directions to correct warpage in either direction.

6. The warp-compensating memory-module test socket of claim 5 further comprising:
    a second servo that is activated to move the second perpendicular rod along the perpendicular axis toward the middle of the memory module.

7. The warp-compensating memory-module test socket of claim 2 further comprising:
    a pusher plate situated above the memory module to push against a top edge of the memory module, the top edge being opposite the connector edge, the pusher plate being moved downward to force the memory module downward into the memory module extender socket;
    a triangular guide in the pusher plate, the triangular guide contacting the top edge of the memory module, wherein the triangular guide applies a top perpendicular force to a middle of the top edge of the memory module when the memory module comprises a module PCB that is warped in the middle;
    wherein the top perpendicular force bends the memory module to allow the middle of the memory module to fit into the socket slot when the memory module comprises the module PCB that is warped.

8. The warp-compensating memory-module test socket of claim 2 wherein the end guides are fixed to the support plate by screws, bolts, or pins;
    wherein the end guides are placed over ends of the memory module extender socket, wherein the end guides clamp the ends of the memory module extender socket to the support plate.

9. The warp-compensating memory-module test socket of claim 8 wherein the end guides are formed from metal.

10. The warp-compensating memory-module test socket of claim 8 wherein the support plate is formed from rigid plastic.

11. A test apparatus comprising:
    extender socket means for receiving a connector edge of a memory module under test;

motherboard means for executing test programs to test the memory module under test, the motherboard means having a memory module socket;

extender card means for electrically connecting contacts inside the extender socket means to metal contacts on a card connector edge of the extender card means, the card connector edge for insertion into the memory module socket on the motherboard means;

support plate means, mounted above the memory module socket on the motherboard means and having an opening directly above the memory module socket, for supporting the extender socket means;

first end guide means, mounted to the support plate means at a first end of the opening in the support plate means, for guiding an end edge of the memory module under test toward a better alignment of the connector edge with the extender socket means;

second end guide means, mounted to the support plate means at a second end of the opening in the support plate means opposite the first end, for guiding an end edge of the memory module under test toward a better alignment of the connector edge with the extender socket means; and perpendicular force means for applying a perpendicular force to a middle of the memory module under test, the perpendicular force being normal to an ideal plane of a module board that supports memory chips in the memory module under test, wherein the perpendicular force reduces a degree of warpage of the module board to ease insertion into the extender socket means, whereby warpage of the module board is reduced by the perpendicular force.

12. The test apparatus of claim 11 wherein the perpendicular force means comprises pusher plate means for exerting a downward force on a top edge of the memory module under test, the top edge being opposite the connector edge.

13. The test apparatus of claim 12 wherein the pusher plate means further comprises triangular groove means for receiving the top edge, the triangular groove means applying the perpendicular force to the top edge of the memory module under test when the module board is warped and the downward force is exerted.

14. The test apparatus of claim 11 wherein the perpendicular force means comprises a first movable rod, the first movable rod moving along a perpendicular axis that is perpendicular to the ideal plane of the memory module under test.

15. The test apparatus of claim 14 wherein the perpendicular force means further comprises a second movable rod, the second movable rod moving along the perpendicular axis that is perpendicular to the ideal plane of the memory module under test;

wherein the second movable rod applies a perpendicular force that is opposite to the perpendicular force applied by the first movable rod, wherein the first movable rod and the second movable rod apply inward and opposing forces onto the middle of the memory module under test to reduce warpage during testing.

16. The test apparatus of claim 11 wherein the motherboard means comprises a personal computer motherboard.

17. A warp-resistant memory module test socket comprising:

an extender socket for receiving a connector edge of a memory module under test;

an extender card having a lower edge for inserting into a memory module socket on a motherboard;

wiring traces on the extender card that electrically connect the extender card to metal contact pads on the lower edge;

a support plate having an opening for the extender card;

a first end guide, mounted to the support plate near a first end of the opening;

a second end guide, mounted to the support plate near a second end of the opening;

a funnel guide formed in the first end guide and in the second end guide, the funnel guide having a gradually reduced cross-section opening that guides an edge of the memory module under test toward the extender socket as the memory module under test is inserted further into the funnel guide; and a perpendicular forcer that applies a perpendicular force to a middle of the memory module under test, the perpendicular force being normal to an ideal plane of a module board that supports memory chips in the memory module under test, wherein the perpendicular force reduces a degree of warpage of the module board to ease insertion into the extender socket, whereby warpage of the module board is reduced by the perpendicular force.

18. The warp-resistant memory module test socket of claim 17 wherein the perpendicular forcer comprises a pusher plate that exerts a downward force on a top edge of the memory module under test, the top edge being opposite the connector edge;

wherein the pusher plate further comprises a triangular groove, the triangular groove receiving the top edge, the triangular groove applying the perpendicular force to the top edge of the memory module under test when the module board is warped and the downward force is exerted.

19. The warp-resistant memory module test socket of claim 17 wherein the perpendicular forcer comprises a first movable rod, the first movable rod moving along a perpendicular axis that is perpendicular to the ideal plane of the memory module under test.

20. The warp-resistant memory module test socket of claim 19 wherein the perpendicular forcer further comprises a second movable rod, the second movable rod moving along the perpendicular axis that is perpendicular to the ideal plane of the memory module under test;

wherein the second movable rod applies a perpendicular force that is opposite to the perpendicular force applied by the first movable rod, wherein the first movable rod and the second movable rod apply inward and opposing forces onto the middle of the memory module under test to reduce warpage during testing.

* * * * *